United States Patent
Lee et al.

(10) Patent No.: US 8,994,888 B2
(45) Date of Patent: Mar. 31, 2015

(54) DISPLAY APPARATUS AND METHOD OF MANUFACTURING THE SAME

(75) Inventors: Yun-Seok Lee, Cheonan-si (KR); Young-Je Cho, Cheonan-si (KR); Cheon-Jae Maeng, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1555 days.

(21) Appl. No.: 12/403,695

(22) Filed: Mar. 13, 2009

(65) Prior Publication Data

US 2009/0230402 A1    Sep. 17, 2009

(30) Foreign Application Priority Data

Mar. 13, 2008    (KR) .................. 10-2008-0023493

(51) Int. Cl.
*G02F 1/136*    (2006.01)
*H01L 27/12*    (2006.01)

(52) U.S. Cl.
CPC .............. *H01L 27/12* (2013.01); *H01L 27/124* (2013.01); *H01L 27/1248* (2013.01); *H01L 27/1288* (2013.01)
USPC ........................................................ 349/43

(58) Field of Classification Search
None
See application file for complete search history.

(56) References Cited

U.S. PATENT DOCUMENTS

| 7,994,502 B2 * | 8/2011 | Yamazaki et al. ............... 257/57 |
| 2003/0179325 A1 * | 9/2003 | Rho et al. .......................... 349/43 |

FOREIGN PATENT DOCUMENTS

| JP | H08136951 A | | 5/1996 |
| JP | 2007115750 A | * | 5/2007 |
| KR | 1019990026576 A | | 4/1999 |
| KR | 1020020034284 A | | 5/2002 |
| KR | 1020060011618 A | | 2/2006 |

OTHER PUBLICATIONS

Takami et al. JP 2007-115750-A published May 10, 2007. Machine translation of detailed description, 9 pages.*

* cited by examiner

*Primary Examiner* — Sarah Hahm
(74) *Attorney, Agent, or Firm* — Cantor Colburn LLP

(57) ABSTRACT

A display apparatus including a first substrate including a pixel area; a gate line disposed on the first substrate; a data line disposed on the first substrate and insulated from the gate line; an insulating layer pattern interposed between the gate line and the data line in an area where the gate line and the data line overlap; a gate insulating layer interposed between the gate line and the data line; a pixel electrode disposed in the pixel area; and a second substrate facing the first substrate.

10 Claims, 20 Drawing Sheets and all the benefits accruing therefrom under 35 U.S.C. §119, the contents of which in its entirety are herein incorporated by reference.

DISPLAY APPARATUS AND METHOD OF MANUFACTURING THE SAME

This application claims priority to Korean Patent Application No. 2008-23493, filed on Mar. 13, 2008, and all the benefits accruing therefrom under 35 U.S.C. §119, the contents of which in its entirety are herein incorporated by reference.

BACKGROUND OF THE INVENTION

1. Field of the Invention

This disclosure relates to a display apparatus and a method of manufacturing the display apparatus.

2. Description of the Related Art

A display apparatus displays an image corresponding to an external input signal in a pixel area. The display apparatus includes a first substrate, a second substrate coupled to and facing the first substrate, and metal wires, which receive the external input signal and are disposed on the first substrate or the second substrate to transmit the external input signal to the pixel area.

The external input signal transmitted through the metal wires can be delayed for various reasons. For example, when a capacitor having the metal wires as its electrodes is disposed in an area where the metal wires cross each other, the capacitor can delay the external input signal transmitted through the metal wires, deteriorating a display quality of the display device.

It is therefore desirable to have a display device wherein an external input signal is not delayed.

BRIEF SUMMARY OF THE INVENTION

An exemplary embodiment provides a display apparatus capable of improving a display quality.

Another exemplary embodiment provides a method of manufacturing the display apparatus capable of improving a display quality.

The above described and other drawbacks are alleviated by a display apparatus including a first substrate including a pixel area, a gate line disposed on the first substrate, a data line disposed on the first substrate and insulated from the gate line, an insulating layer pattern interposed between the gate line and the data line in an area where the gate line and the data line overlap; a gate insulating layer interposed between the gate line and the data line; a pixel electrode disposed in the pixel area; and a second substrate facing the first substrate.

The insulating layer pattern can be interposed between the gate line and the data line at least in an area where the gate line and the data line are overlapped with each other. Thus, the gate line and the data line are spaced apart from each other by a thickness of the insulating layer pattern, and a capacitance of a capacitor including the gate line and the data line is reduced. As a result, a data signal transmitted through the data line can be prevented from being delayed.

In another exemplary embodiment, a method of manufacturing a display apparatus includes disposing a conductive layer on a first substrate, the first substrate including a pixel area; disposing an insulating layer pattern on the conductive layer; etching the conductive layer using the insulating layer pattern as a mask to dispose a gate line under the insulating layer pattern; disposing a gate insulating pattern to substantially cover the insulating layer pattern and the gate line; disposing a data line on the gate insulating layer; disposing a pixel electrode in a pixel area; and coupling the first substrate to a second substrate.

The gate insulating layer pattern disposed on the conductive layer to dispose the gate line can remain on the gate line after the gate line is disposed. Thus, the insulating layer pattern is interposed between the gate line and the data line to space apart the gate line and the data line from each other by a thickness of the insulating layer pattern, and as a result a capacitance of a capacitor including the gate line and the data line can be reduced.

In another exemplary embodiment, a method of manufacturing a display apparatus includes disposing a conductive layer on a first substrate, the first substrate including a pixel area; disposing a low dielectric layer on the conductive layer; disposing an insulating layer pattern on the low dielectric layer; patterning the low dielectric layer using the insulating layer pattern as a mask to dispose a low dielectric layer pattern; patterning the conductive layer using the insulating layer pattern as a mask to dispose a gate line, which is substantially covered by the low dielectric layer pattern; removing the insulating layer pattern; disposing a gate insulating layer is formed to substantially cover the low dielectric layer pattern and the gate line; disposing a data line on the gate insulating layer; disposing a pixel electrode in the pixel area; and coupling the first substrate with a second substrate.

According to the above, the insulating layer pattern can be interposed between the gate line and the data line, thus the gate line and the data line can be spaced apart by the thickness of the insulating layer pattern in an area where the gate line crosses the data line. Thus, the capacitance of the capacitor including the gate line and the data line may be reduced, so that a delay of a data signal transmitted through the data line may be reduced or substantially prevented.

These and other features, aspects, and advantages of the disclosed embodiments will become better understood with reference to the following description and appended claims.

BRIEF DESCRIPTION OF THE DRAWINGS

The above and other advantages of the disclosed embodiments will become readily apparent by reference to the following detailed description when considered in conjunction with the accompanying drawings wherein.

Figure 1:
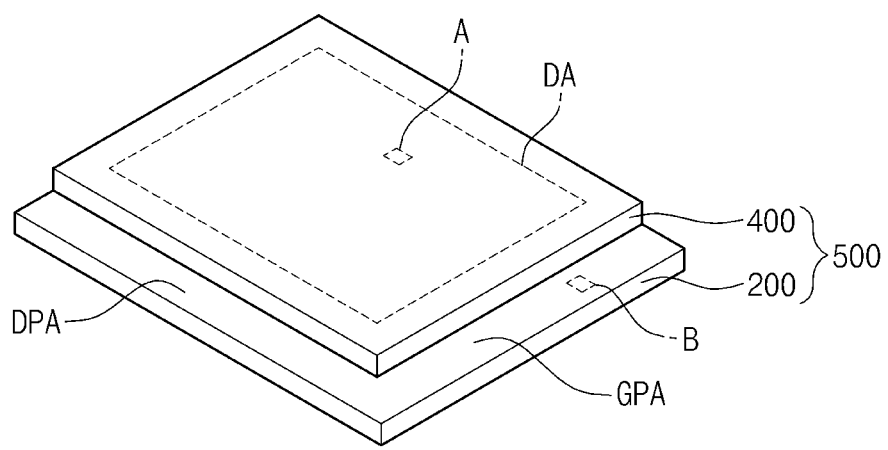
FIG. 1 is a perspective view showing an exemplary embodiment of a liquid crystal display ("LCD")

The detailed description explains the disclosed embodiments, together with advantages and features, by way of example with reference to the drawings.

DETAILED DESCRIPTION OF THE INVENTION

Aspects, advantages, and features of the present invention and methods of accomplishing the same may be understood more readily by reference to the following detailed description of preferred embodiments and the accompanying drawings. The present invention may, however, may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings. The aspects, features, and advantages of the present invention are not restricted to the ones set forth herein. The above and other aspects, features and advantages of the present invention will become more apparent to one of ordinary skill in the art to which the present invention pertains by referencing a detailed description of the present invention given below.

Figure 2:
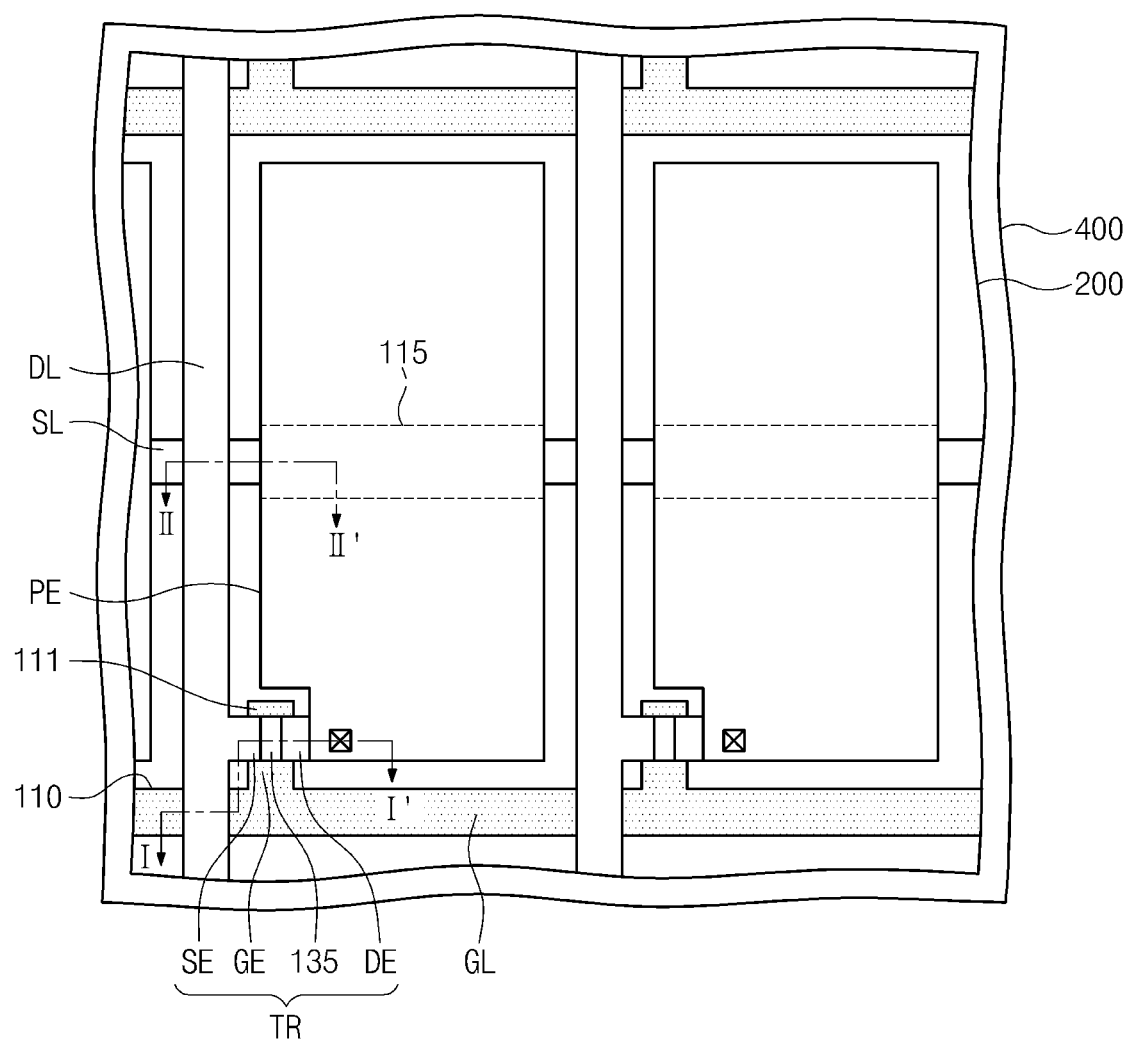
FIG. 2 is a plan view of portion A of FIG. 1.

FIG. 1 is a perspective view showing an exemplary embodiment of a liquid crystal display according to the present invention, and FIG. 2 is an enlarged view showing portion A of FIG. 1.

Referring to FIGS. 1 and 2, a liquid crystal display ("LCD") 500 includes an array substrate 200, a color filter substrate 400 facing the array substrate 200, and a liquid crystal (not shown) interposed between the array substrate 200 and the color filter substrate 400. The LCD 500 includes a display area DA, which is defined on the color filter substrate 400 and wherein an image can be displayed, and a gate pad GPA and a data pad DPA, which are defined on the array substrate 200 outside the display area DA.

A plurality of pixel areas is defined on the array substrate 200, and a plurality of pixel electrodes is arranged in the pixel areas, respectively. Also, a plurality of gate lines and a plurality of data lines, which is insulated from the gate lines and disposed perpendicular to the gate lines, are disposed on the array substrate 200. In an exemplary embodiment, each pixel area is defined by the gate lines and the data lines. For example, two adjacent gate lines GL are disposed perpendicular to two adjacent data lines DL and define a pixel area, and a pixel electrode PE is disposed in the pixel area. In addition, a thin film transistor TR, which is disposed adjacent to the pixel electrode PE and electrically connected to the pixel electrode PE, is disposed on the array substrate 200.

In an embodiment, because the LCD 500 controls a light transmittance according to an alignment of the liquid crystal to display an image, which is controlled by the pixel electrode PE, the pixel area may be defined by an area where the pixel electrode PE is arranged.

The thin film transistor TR includes a gate electrode GE, which branches from the gate line GL, a source electrode SE, a drain electrode DE, and a semiconductor pattern 135. The gate electrode GE branches from the gate line GL, and the source electrode SE branches from the data line DL. Also, the drain electrode DE includes a same material as the source electrode SE and is spaced apart from the source electrode SE.

The semiconductor pattern 135 includes an active pattern 130 (shown in FIG. 3) and an ohmic contact pattern 131 (shown in FIG. 3), and is disposed between the gate electrode GE and the source electrode SE and between the gate electrode GE and the drain electrode DE.

A first insulating layer pattern 110 is disposed on the gate line GL, and a second insulating layer pattern 111 is disposed on the gate electrode GE. The first insulating layer pattern 110 is interposed between the gate line GL and the data line DL, and the second insulating layer pattern 111 is interposed between the gate electrode GE and the source electrode SE and between the gate electrode GE and the drain electrode DE outside a channel area CA (shown in FIG. 3). The gate line GL is spaced apart from the data line DL by the first insulating layer pattern 110 in an area where the gate line GL crosses the data line DL. Accordingly, in an embodiment, a capacitance of a capacitor including the gate line GL and the data line DL may be reduced.

In addition, the first insulating layer pattern 110 is disposed on the gate line GL. In an embodiment, the first insulating layer pattern 110 may be interposed between the gate line GL and the data line DL only in an area where the gate line GL crosses the data line DL.

Also, in an embodiment, each of the first and second insulating layer patterns 110 and 111 does not overlap the pixel electrode PE. Thus, in an embodiment, each of the first and second insulating layer patterns 110 and 111 is not disposed in the pixel area. Thus, the transmittance of the light passing through the pixel electrode PE is not reduced by the first and second insulating layer patterns 110 and 111, thus a reduction in the transmittance of the LCD 500 by the first and second insulating layer patterns 110 and 111 may be reduced or substantially prevented.

Each of the first and second insulating layer patterns 110 and 111 includes a photosensitive material. In an embodiment, each of the first and second insulating layer patterns 110 and 111 may include at least one of a positive photoresist, a negative photoresist, an organic insulating layer, an overcoat layer, or the like.

In an embodiment wherein each of the first and second insulating layer patterns 110 and 111 include a photoresist, it is desirable for the first and second insulating layer patterns 110 and 111 to comprise a negative photoresist having a thermal resistance, which is greater than a thermal resistance of the positive photoresist. Thus thermal degradation of the first and second insulating layer patterns 110 and 111, which can result for example from treatment at a temperature over about 250° C., may be reduced or substantially prevented when the first and second insulating layer patterns 110 and 111 include the negative photoresist. Therefore, even though each of the first and second insulating layer patterns 110 and 111 including the negative photoresist is exposed to a high temperature, such as a temperature greater than about 250° C., which can occur in a manufacturing process of the array substrate 200, thermal decomposition of the first and second insulating layer patterns 110 and 111 may be reduced or substantially eliminated.

In an embodiment wherein an organic insulating layer 150 (shown in FIG. 3) disposed in the LCD 500 includes the photosensitive material, the first insulating layer pattern 110 and the organic insulating layer 150 may consist of the same material. Also, in an embodiment wherein an overcoat layer 310 (shown in FIG. 3) disposed in the LCD 500 includes the photosensitive material, the first insulating layer pattern 110 and the overcoat layer 350 may include the same material. Thus, the first insulating layer pattern 110 and the second insulating layer pattern 111 may be disposed using the photosensitive material which is used to manufacture the LCD 500.

As described above, in an exemplary embodiment, each of the first and second insulating layer patterns 110 and 111 includes the photosensitive material. In an embodiment, the first and second insulating layer patterns 110 and 111 may include a low dielectric material, such as SiOC or SiOF. In an embodiment wherein the first and second insulating layer patterns 110 and 111 include the low dielectric material, the first and second insulating layer patterns 110 and 111 may have a dielectric constant less than or equal to about 4, specifically less than or equal to about 3.

In an embodiment, the gate line GL is disposed in the gate pad area GPA, and a gate pad GLP (shown in FIG. 5) which contacts an end portion of the gate line GL is disposed in the gate pad area GPA. The array substrate 200 may be electrically connected to a gate driver (not shown) through the gate pad GLP, and the array substrate 200 may receive a gate signal through the gate line GL to turn on the thin film transistor TR. Also, the array substrate 200 may be electrically connected to a data driver (not shown) in the data pad area DPA, thereby receiving a data signal through the data line DL.

The array substrate 200 includes a storage line SL spaced apart from the gate line GL and a storage electrode 115, which branches from the storage line SL. The storage line SL and the storage electrode 115 may include a same material as the gate line GL and overlap the pixel electrode PE to form a capacitor with the pixel electrode PE.

In an area where the data line DL overlaps the storage line SL, a third insulating layer pattern 112 (shown in FIG. 4) is disposed on the storage line SL. The data line DL is insulated from the storage line SL by the third insulating layer pattern to reduce a capacitance of a capacitor including the data line DL and the storage line SL in an area where the data line DL crosses the storage line SL. The third insulating layer pattern 112 is further described with reference to FIG. 4.

Figure 3:
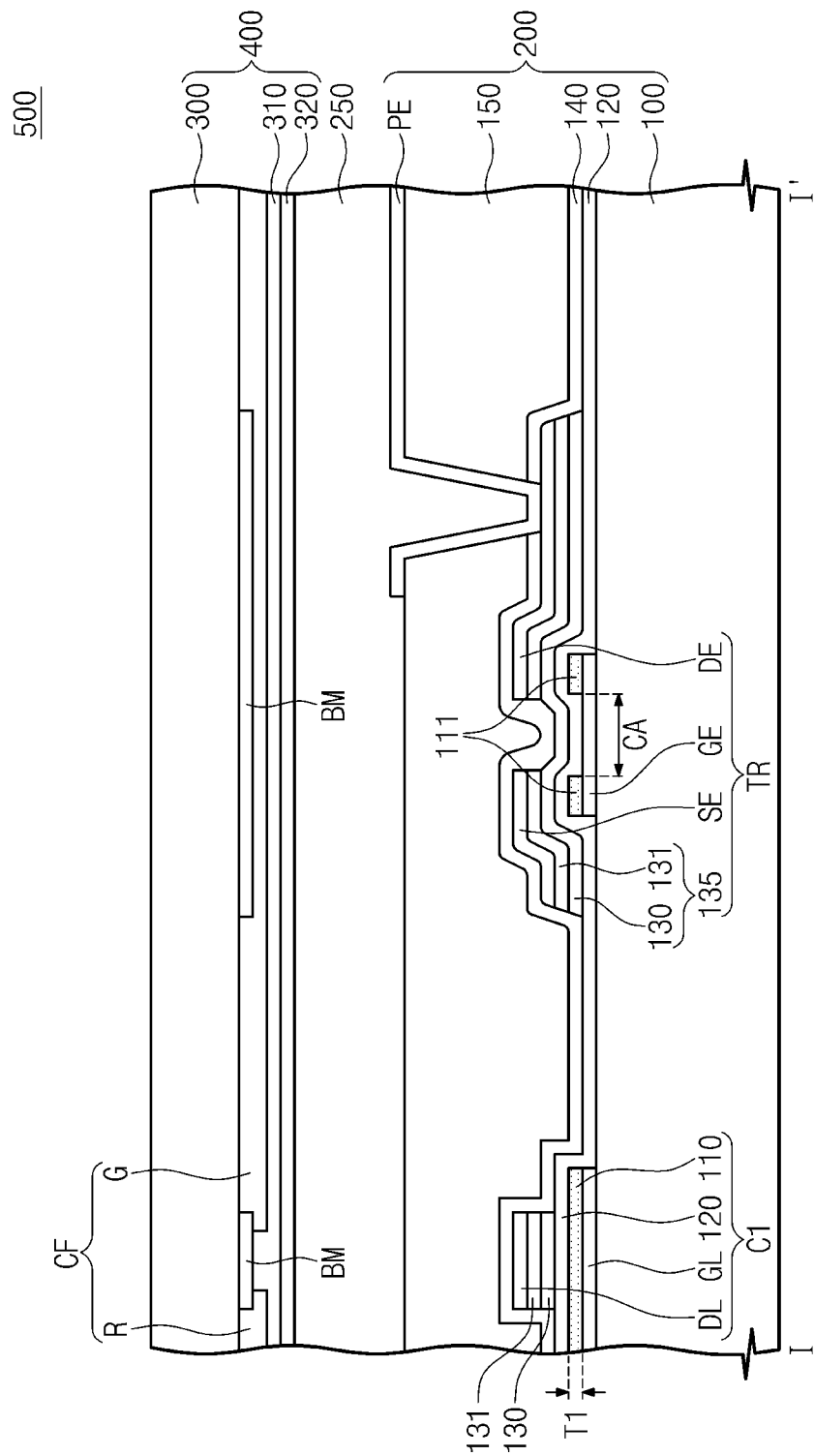
FIG. 3 is a cross-sectional view taken along line I-I' of FIG. 2.

FIG. 3 is a cross-sectional view taken along line I-I' of FIG. 2.

Referring to FIG. 3, the array substrate 200 includes a first base substrate 100, and the thin film transistor TR, and the pixel electrode PE electrically connected to the thin film transistor TR, are disposed on the first base substrate 100. In addition, the gate line GL is disposed on the first base substrate 100, and the data line DL is disposed on the gate line GL, and a gate insulating layer 120 is interposed therebetween.

In an exemplary embodiment, wherein the data line DL is substantially simultaneously disposed with the active pattern 130 and the ohmic contact pattern 131, the active pattern 130 and the ohmic contact pattern 131 are disposed under the data line DL. In an embodiment, the data line DL may be disposed using a different mask from that of the active pattern 130 and the ohmic contact pattern 131.

A first capacitor C1, including the gate line GL, the data line DL, the first insulating layer pattern 110, and the gate insulating layer 120, is disposed in the area where the gate line GL overlaps the data line DL. The first capacitor C1 may delay the data signal transmitted through the data line DL. In an embodiment wherein the first insulating layer pattern 110 is disposed on the gate line GL, a capacitance of the first capacitor C1 is reduced, thereby reducing a delay of the data signal transmitted through the data line DL.

Since the first insulating layer pattern 110 can reduce the capacitance of the first capacitor C1, an on-current of the thin film transistor TR may be increased by decreasing a thickness of the gate insulating layer 120. In an embodiment, as the thickness of the gate insulating layer 120 becomes thinner, the on-current of the thin film transistor TR increases. However, as the thickness of the gate insulating layer 120 becomes thinner, a capacitance of a parasitic capacitor can be increased, wherein the parasitic capacitance is generated in the area where the gate line GL (shown in FIG. 2) crosses the data line DL (shown in FIG. 2) and causes the delay of the data signal transmitted through the data line DL. Therefore, there is a limitation in decreasing the thickness of the gate insulating layer 120 to increase the on-current of the thin film transistor TR. In an embodiment, as shown in FIG. 3, when both the gate insulating layer 120 and the first insulating layer pattern 110 are interposed between the gate line GL and the data line DL, the on-current of the thin film transistor TR may be increased and the thickness of the gate insulating layer 120 decreased, in contrast to an embodiment wherein only the gate insulating layer 120 is interposed between the gate line GL and the data line DL.

The first insulating layer pattern 110 has a first thickness T1 of between about 1500 angstroms (Å) to about 40000 Å, specifically between about 2500 Å to about 20000 Å, and the capacitance of the first capacitor C1 is inversely proportional to a distance between the gate line GL and the data line DL. Therefore, since the first insulating layer pattern 110 is disposed between the gate line GL and the data line DL, the distance between the gate line GL and the data line DL can be increased by the thickness of the first insulating layer pattern 110. As a result, the capacitance of the first capacitor C1 is reduced, thereby reducing the delay of the data signal transmitted through the data line DL.

If the thickness of the first insulating layer pattern 110 is less than about 1500 Å, specifically about 2500 Å, the capacitance of the first capacitor C1 can be decreased by less than about 50 percent (%) due to the first insulating layer pattern 110 interposed between the gate line GL and the data line DL. Accordingly, in an embodiment the capacitance of the first capacitor C1 may not be significantly reduced. In addition, if the first thickness T1 of the first insulating layer pattern 110 is greater than about 40000 Å, specifically about 20000 Å, a time for manufacturing the first insulating layer pattern 110 can be increased, and thus a layer uniformity of the first insulating layer pattern 110 may be deteriorated. Thus, in an embodiment, it can be desirable for the first insulating layer pattern 110 to have a thickness of about 2500 Å to about 20000 Å.

As described above, the first insulating layer pattern 110 may include the low dielectric material, such as SiOC, SiOF, or the like, or a combination comprising at least one of the foregoing low dielectric materials, and have the dielectric constant less than or equal to about 4, specifically less than or equal to about 3. In an embodiment wherein the first and second insulating layer patterns 110 and 111 include the low dielectric material, the first insulating layer pattern 110 may have a first thickness T1 of between about 2500 Å to about 20000 Å, specifically between about 5000 Å to about 10000 Å. Also, in an embodiment wherein the first insulating layer pattern 110 includes the low dielectric material, the first insulating layer pattern 110 can increase the distance between the gate line GL and the data line DL to reduce the capacitance of the first capacitor C1, as well as decrease the dielectric constant of the first insulating layer pattern 110 to reduce the capacitance of the first capacitor C1.

In addition, the second insulating layer pattern 111 is disposed on the gate electrode GE. The second insulating layer pattern 111 can include the same material as the first insulating layer pattern 110, and the second insulating layer pattern 111 can be partially removed in an area corresponding to the channel area CA in order to prevent a driving capability of the thin film transistor TR from being deteriorated. Thus, the second insulating layer pattern 111 can overlap the source electrode SE and the drain electrode DE outside the channel area CA.

In an exemplary embodiment, the second insulating layer pattern 111, which is partially removed in an area corresponding to the channel area CA, is disposed on the gate electrode GE. In an embodiment, the second insulating layer pattern 111 may not be disposed on the gate electrode GE. The second insulating layer pattern 111 is described in further detail with reference to FIGS. 8 and 9.

In an embodiment, an inter-insulating layer 140 is disposed on the first base substrate 100 to cover the data line DL and the thin film transistor TR, and the organic insulating layer 150 is disposed on the inter-insulating layer 140. The organic insulating layer 150 may include a photosensitive material and a material which has a high transmittance. In an embodiment wherein the organic insulating layer 150 includes the photosensitive material, the first insulating layer pattern 110 and the second insulating layer pattern 111 may include the same material as the organic insulating layer 150.

The inter-insulating layer 140 and the organic insulating layer 150 can be removed to partially expose the drain electrode DE, and the pixel electrode PE is disposed on the organic insulating layer 150, so that the pixel electrode PE may be electrically connected to the drain electrode DE.

The color filter substrate 400 includes a second base substrate 300, and a black matrix BM, a color filter CF, an overcoat layer 310, and a common electrode 320 are disposed on the second base substrate 300.

The black matrix BM includes a material to block a light and is disposed on the second base substrate 300 corresponding to the data line DL, the gate line GL, and the thin film transistor TR. The color filter CF includes a red color filter R, a green color filter G, and a blue color filter (not shown). The color filter CF overlaps the pixel electrode PE and is disposed on the second base substrate 300.

The overcoat layer 310 can cover the color filter CF to improve a flatness of the color filter CF. The overcoat layer 310 may include a material which is cured by light or heat. If the overcoat layer 310 includes the material cured by light or heat, the first insulating layer pattern 110 and the second insulating layer pattern 111 may include the same material as the overcoat layer 310.

The common electrode 320 is disposed on the overcoat layer 310. The common electrode 320 includes a transparent conductive layer and forms an electric field with the pixel electrode PE to control the alignment of the liquid crystal 250.

In an exemplary embodiment, the color filter CF is disposed on the color filter substrate 400. In an embodiment, color filter CF may be disposed on the array substrate 200. In an embodiment wherein the color filter CF is disposed on the array substrate 200, the color filter CF may be disposed either on or under of the pixel electrode PE.

Figure 4:
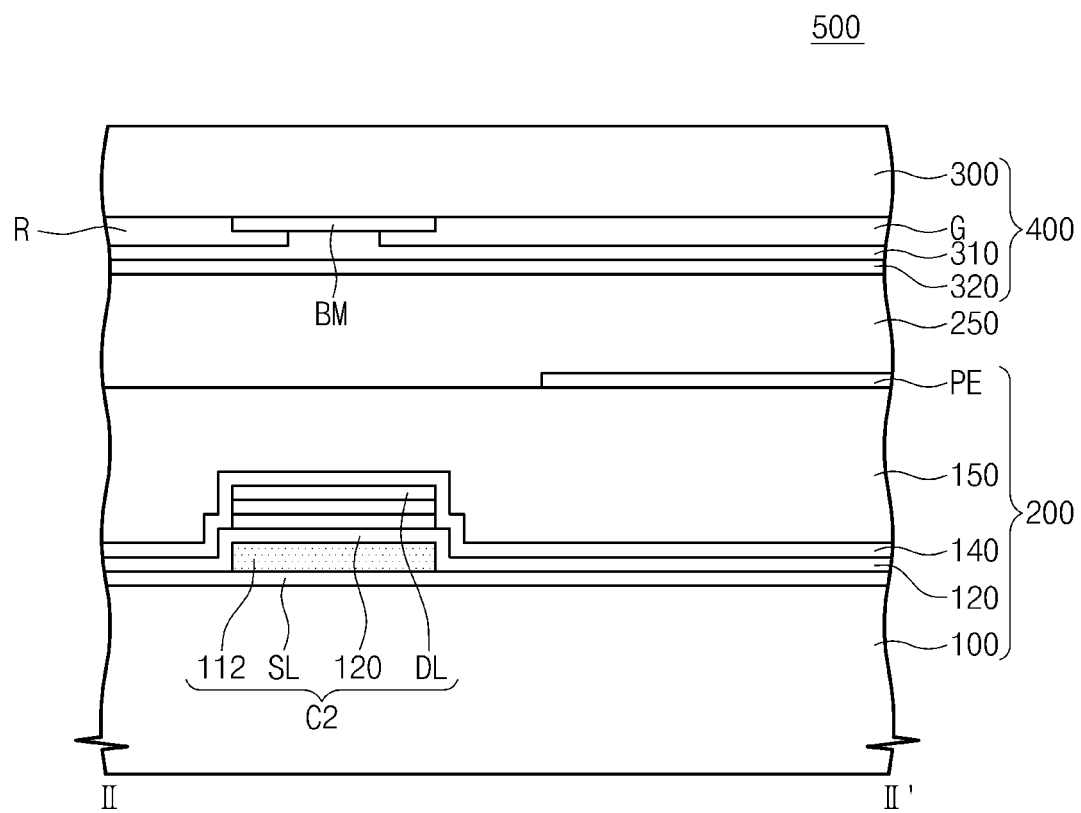
FIG. 4 is a cross-sectional view taken along line II-II' of FIG. 2.

FIG. 4 is a cross-sectional view taken along line II-II' of FIG. 2. In FIG. 4, the same reference numerals denote the same elements in FIGS. 1 to 3, and thus the detailed description of the same elements is omitted.

Referring to FIG. 4, a second capacitor C2 having the data line DL and the storage line SL as its electrodes is disposed in an area where the storage SL overlaps the data line DL.

A third insulating layer pattern 112 is disposed on the storage line SL, and the third insulating layer pattern 112 may include the same material as the first and second insulating layer patterns 110 and 111. The third insulating layer pattern 112 may have a thickness of between about 1500 angstroms (Å) to about 40000 Å, specifically between about 2500 Å to about 20000 Å.

The second capacitor C2 delays the data signal transmitted through the data line DL, however, the third insulating layer pattern 112 is disposed on the storage line SL in the area where the storage line SL crosses the data line DL, thus the storage line SL may be spaced apart from the data line DL by the thickness of the third insulating layer pattern 112. Accordingly, a capacitance of the second capacitor C2 is reduced, thereby decreasing the delay of the data signal transmitted through the data line DL.

Figure 5:
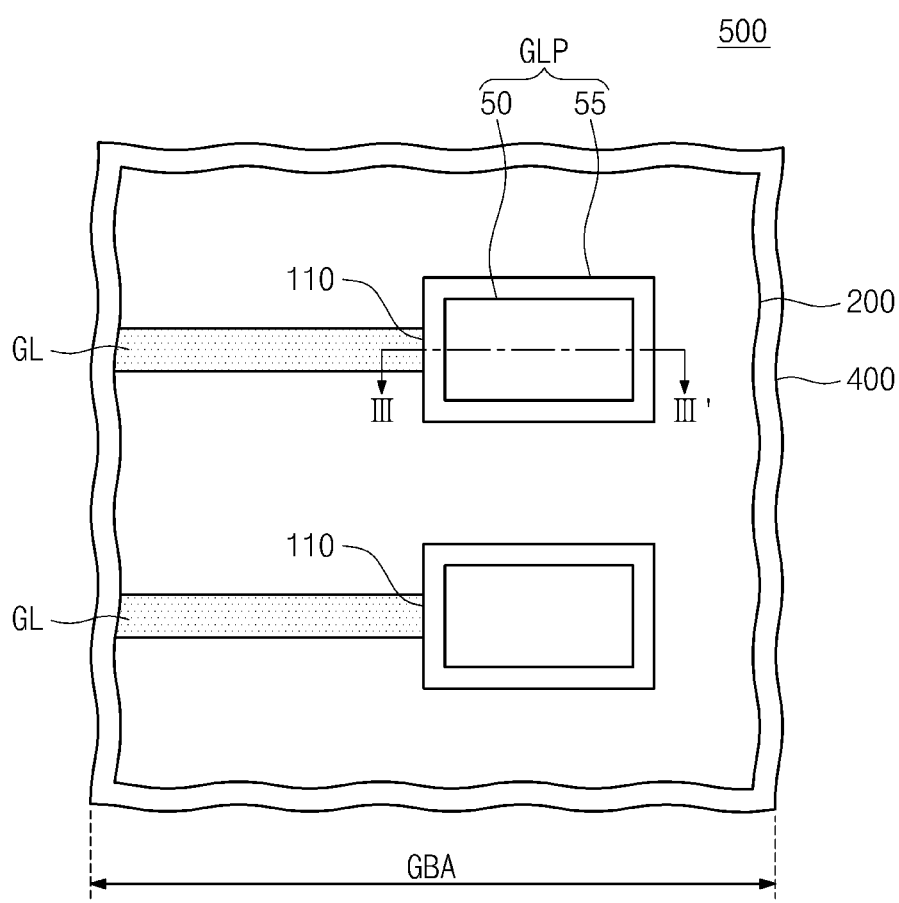
FIG. 5 is a plan view of portion B of FIG. 1.
Figure 6:
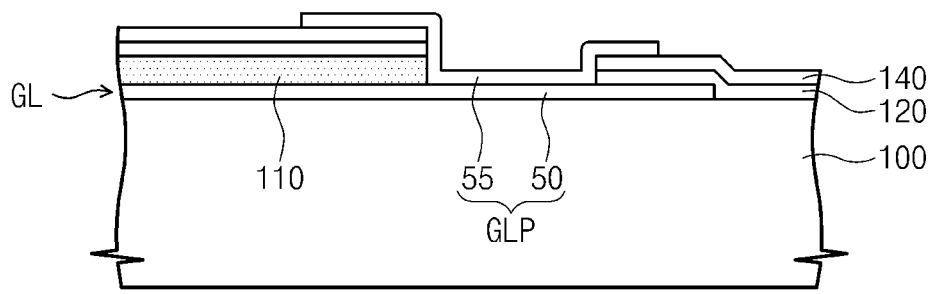
FIG. 6 is a cross-sectional view taken along line III-III' of FIG. 5.

FIG. 5 is a plan view showing portion B of FIG. 1, and FIG. 6 is a cross-sectional view taken along line III-III' of FIG. 5.

Referring to FIGS. 5 and 6, the gate line GL is disposed on the first base substrate 100 in a gate bonding area GBA, and the gate line pad GLP, including an end portion 50 of the gate line GL and a contact part 55, is arranged in an end of the gate line GL. The contact part 55 may include the same material as the pixel electrode PE (shown in FIG. 3), and the end portion 50 of the gate line GL extends from the gate line GL.

As described above, the first insulating layer pattern 110 is disposed on the gate line GL and the first insulating layer pattern 110 can be partially removed in an area corresponding to the gate line pad GLP, so that the end portion 50 of the gate line GL may be electrically connected to the contact part 55.

Referring again to FIG. 2, the first insulating layer pattern 110 is disposed on the gate line GL, and the first insulating layer pattern 110 can be partially removed in the gate bonding area GBA. Thus, the first insulating layer pattern 110 not only reduces the capacitance of the capacitor formed in the area where the gate line GL overlaps the data line DL to decrease the delay of the data signal transmitted through the data line DL, but also reduces the capacitance of the capacitor including adjacent gate lines to decrease the delay of the gate signal transmitted through the gate line GL.

FIGS. 7 to 16 are cross-sectional views showing an exemplary embodiment of a manufacturing process of the liquid crystal display of FIG. 2. In FIGS. 7 to 12, the same reference numerals denote the same elements in FIGS. 1 to 6, and thus the detailed descriptions of the same elements are omitted.

In addition, FIGS. 7 to 12 are cross-sectional views taken along line I-I' of the liquid crystal display shown in FIG. 2 in manufacturing processes of the liquid crystal display.

Figure 7:
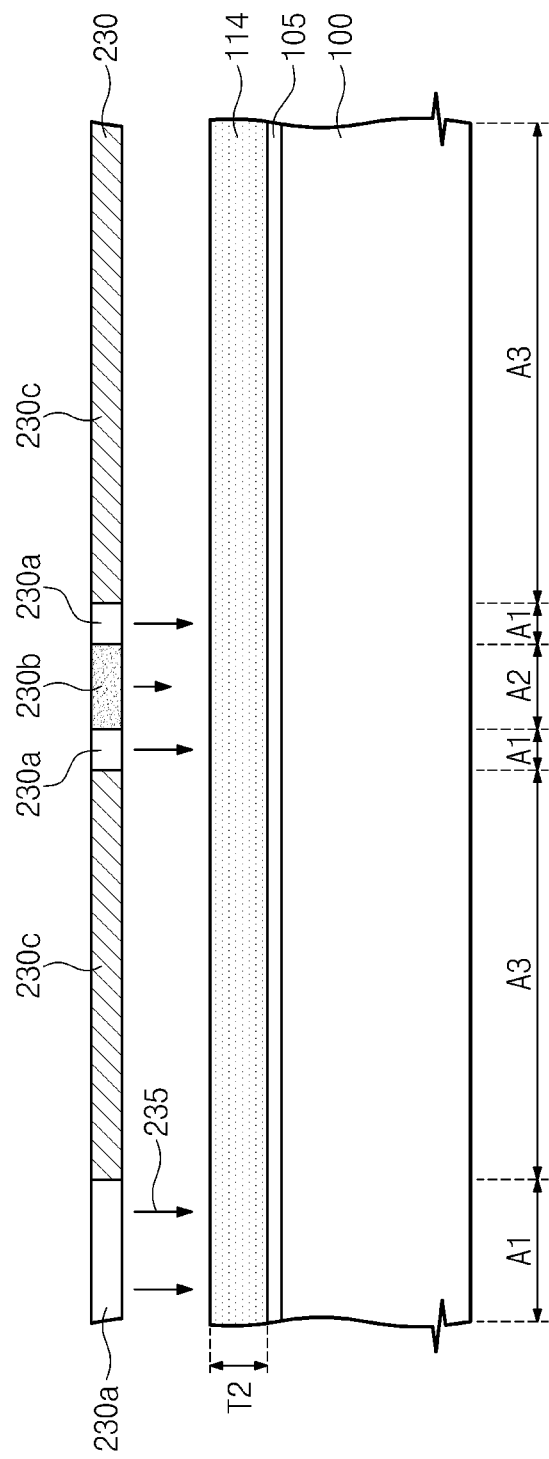
FIGS. 7 to 16 are cross-sectional views showing an exemplary embodiment of a manufacturing process of the liquid crystal display of FIG. 2.
Figure 8:
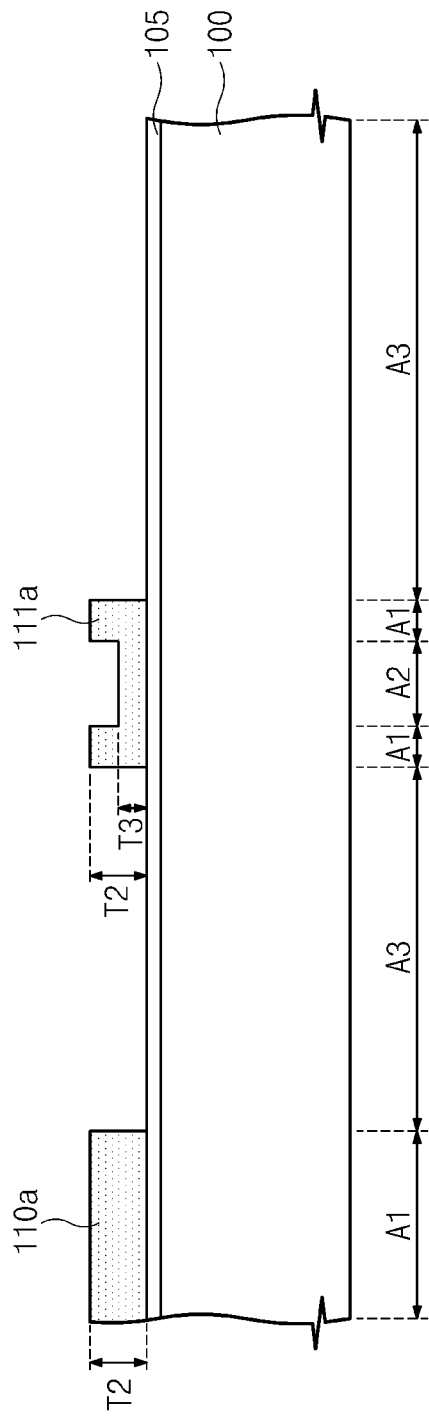

Referring to FIGS. 7 and 8, a preliminary conductive layer 105 is disposed on a first base substrate 100, and an insulating layer 114 is disposed on the preliminary conductive layer 105.

The preliminary conductive layer 105 includes a conductive material and may be disposed on the first base substrate 100 using a deposition method such as sputtering, or the like. Also, the insulating layer 114 includes the photosensitive material, and the insulating layer 114 is disposed to have a second thickness T2 by disposing the negative photoresist on the preliminary conductive layer 105. In an exemplary embodiment, the insulating layer 114 includes the negative photoresist. In an embodiment, the insulating layer 114 may include the positive photoresist, a photosensitive organic material, or the like, or a combination comprising at least one of the foregoing materials. In an embodiment wherein the insulating layer 114 includes the positive photoresist and the positive photoresist is not cured by light, a structure of a slit mask 230 for the insulating layer 114 can be changed.

After disposing the insulating layer 114 on the preliminary conductive layer 105, the insulating layer 114 can be exposed to light using the slit mask 230. The slit mask 230 includes a transmission region 230a, corresponding to a first area A1, which may transmit light, a semi-transmission region 230b corresponding to a second area A2, and a non-transmission region 230c corresponding to a third area A3, which can block the light. The semi-transmission region 230b transmits the light therethrough, however, the semi-transmittance region 230b has lower transmittance than that of the transmission region 230a since the semi-transmission region 230b comprises a slit pattern.

When the light 235 is irradiated onto the insulating layer 114 through the slit mask 230, the light 235 is not irradiated onto the third area A3. Also, an amount of light irradiated onto the first area A1 is greater than that of the second area A2.

After exposing the insulating layer 114 to the light 235 using the slit mask 230, the insulating layer 114 is developed to dispose a first preliminary insulating layer pattern 110a and a second preliminary insulating layer pattern 111a. Since the insulating layer 114 includes the negative photoresist cured by light, the first preliminary insulating layer pattern 111a has a second thickness T2 in the first area A1. In addition, the second preliminary insulating layer pattern 111a has the second thickness T2 in the first area A1, and has a third thickness T3, which is smaller than the second thickness T2, in the second area A2.

Figure 9:
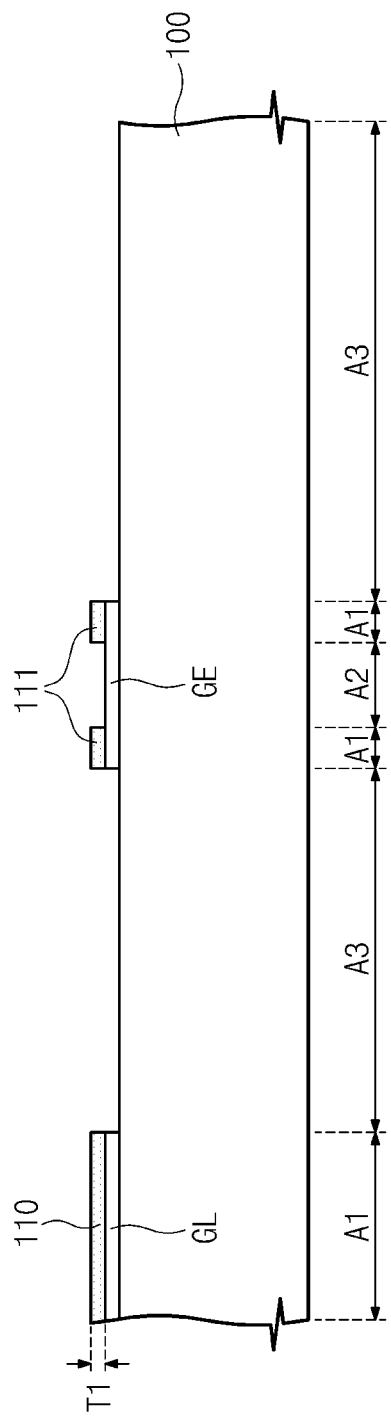

Referring to FIGS. 8 and 9, the preliminary conductive layer 105 is patterned using the first and second preliminary insulating layer patterns 110a and 111a as a mask. Therefore, the gate line GL is disposed in the first area A1, and the gate electrode GE is disposed in the first area A1 and the second area A2.

After disposing the gate line GL and the gate electrode GE, each of the first and second preliminary insulating layer patterns 110a and 111a is etched by the third thickness T3 to dispose a first insulating layer pattern 110 and a second insulating layer pattern 111. As a result, each of the first and second insulating layer patterns 110 and 111 has the first thickness T1, which is equal to about a difference between the third thickness T3 and the second thickness T2. Also, the second insulating layer pattern 111 is removed in the second area A2 to expose the gate electrode GE to an exterior in the second area A2.

In an exemplary embodiment, the second insulating layer pattern 111, which partially exposes the gate electrode GE, is disposed on the gate electrode GE. In an embodiment, the second insulating layer pattern 111 may not be disposed on the gate electrode GE. In an embodiment wherein the second insulating layer pattern 111 is not disposed on the gate electrode GE, an area which is exposed to the light 235 through the semi-transmission region 230b (shown in FIG. 7) is increased since the insulating layer 114 (shown in FIG. 7) overlaps substantially an entire surface of the gate electrode GE and is exposed to the light 235 through the semi-transmission region 230b (shown in FIG. 7) in which the slit pattern is disposed. As the area exposed to the light 235 using the semi-transmission region 230b increases, an efficiency of a manufacturing process can be reduced. Therefore, it is desirable to dispose the second insulating layer pattern 111 on the gate electrode GE to reduce the area exposed to the light 235 using the semi-transmission area 230b.

Figure 10:
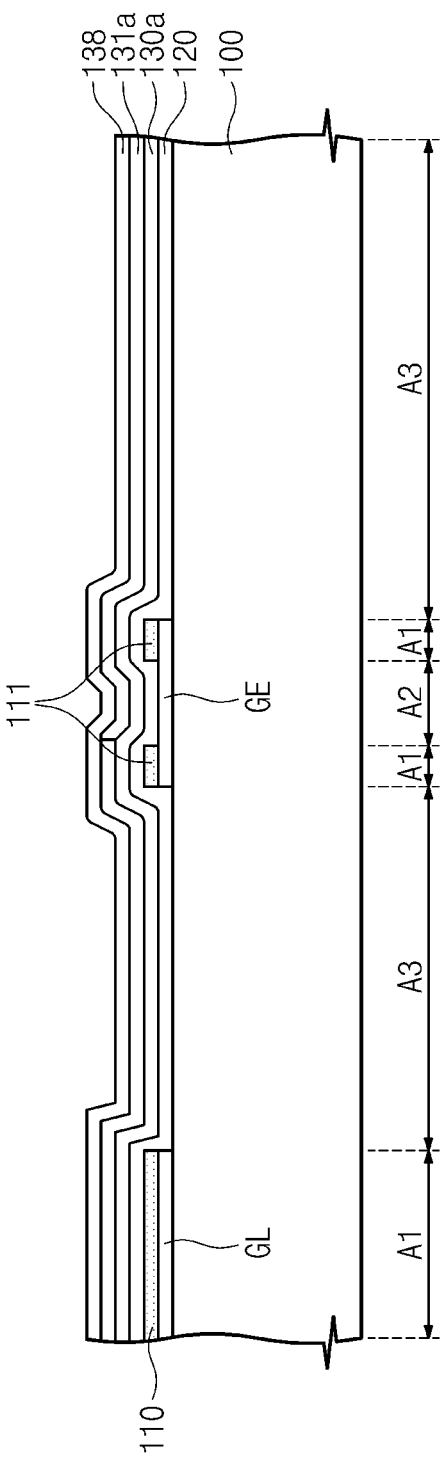
Figure 11:
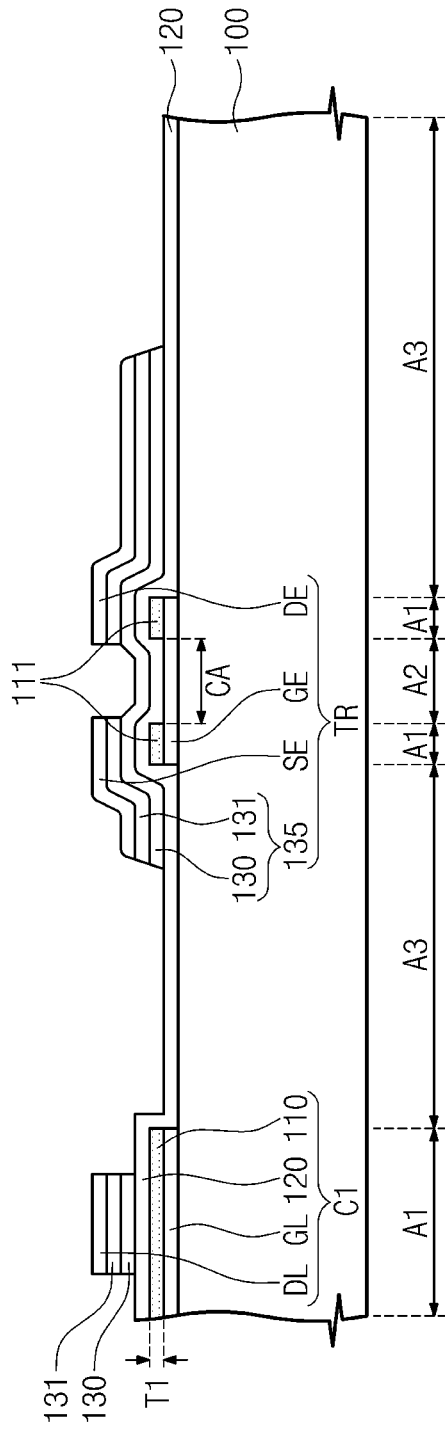

Referring to FIGS. 10 and 11, the gate insulating layer 120 is disposed to cover the first and second insulating layer patterns 110 and 111. After disposing the gate insulating layer 120, a preliminary active layer 130a, a preliminary ohmic contact layer 131a, and a preliminary source-drain layer 138 are sequentially disposed.

After disposing the preliminary active layer 130a, the preliminary ohmic contact layer 131a, and the preliminary source-drain layer 138, the preliminary active layer 130a, the preliminary ohmic contact layer 131a, and the preliminary source-drain layer 138 are patterned to dispose the active pattern 130, the ohmic contact pattern 131, and the data line DL, the source electrode SE, and the drain electrode DE, respectively. Thus, as shown in FIG. 11, the disposing of the semiconductor pattern 135, including the active pattern 130 and the ohmic contact pattern 131, is completed, and the disposing of the thin film transistor TR, including the source electrode SE, the gate electrode GE, and the drain electrode DE, is completed.

Also, the first capacitor C1, having the gate line GL and the data line DL as its electrodes, is disposed in the area where the gate line GL overlaps the data line DL. The capacitance of the first capacitor C1 delays the data signal transmitted through the data line DL, however, the first insulating layer pattern 110 is interposed between the gate line GL and the data line DL, thus the gate line GL may be spaced apart from the data line DL by a distance corresponding to the thickness of the first insulating layer pattern 110. Therefore, the first insulating layer pattern 110 may reduce the capacitance of the first capacitor T1, to thereby decrease the delay of the data signal transmitting through the data line DL.

Figure 12:
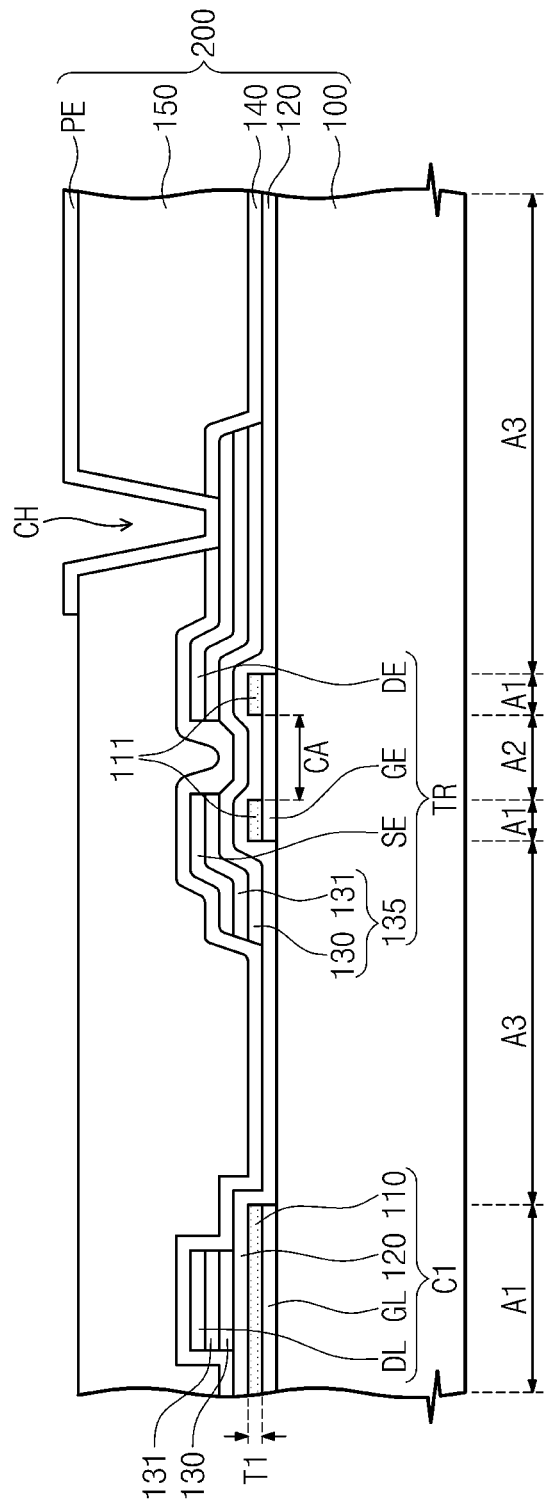

Referring to FIG. 12, the inter-insulating layer 140 is disposed to substantially or entirely cover the thin film transistor TR and the data line DL, and the organic insulating layer 150 is disposed on the inter-insulating layer 140.

After disposing the inter-insulating layer 140 and the organic insulating layer 150, the inter-insulating layer 140 and the organic insulating layer 150 are removed to dispose a contact hole CH therethrough, thus the drain electrode DE may be exposed through the contact hole CH. After disposing the contact hole CH, the pixel electrode PE, which fills in the contact hole CH, is disposed on the organic insulating layer 150 such that the pixel electrode is electrically connected to the drain electrode DE. Thus, the disposing of array substrate 200 is complete.

Referring again to FIG. 3, after the disposing of the array substrate 200 is completed, the liquid crystal 250 is disposed on the array substrate 200 and the color filter substrate 400 is coupled with the array substrate 200, thereby completing the manufacture of the liquid crystal display 500.

Figure 13:
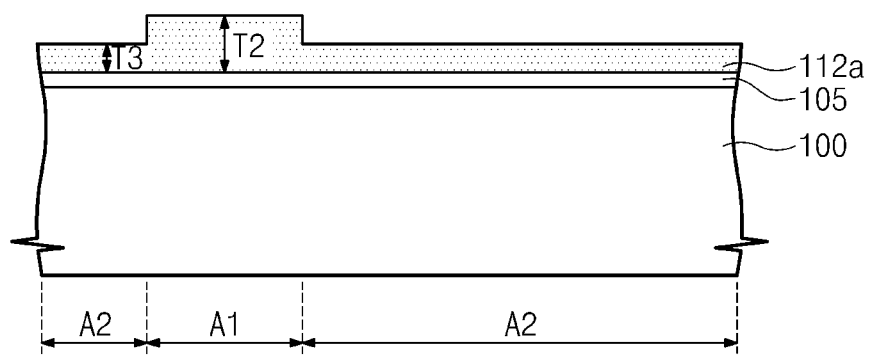
Figure 14:
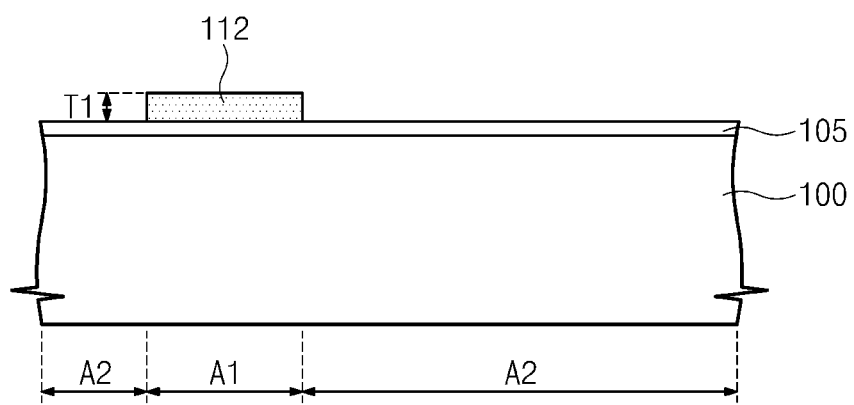

FIGS. 13 and 14 are cross-sectional views taken along line II-II' of FIG. 2 in manufacturing processes of the liquid crystal display shown in FIG. 2. FIGS. 8 and 13 show the liquid crystal display in the same manufacturing process, and also FIGS. 9 and 14 show the liquid crystal display in the same manufacturing process.

Referring to FIGS. 7 and 13, the preliminary conductive layer 105 is disposed on the first base substrate 100, and the insulating layer 114 is disposed on the preliminary conductive layer 105. When developing the insulating layer 114, after irradiating a greater amount of light onto the first area A1 than that irradiated onto the second area A2 using the slit mask 230, a third preliminary insulating layer pattern 112a having the second thickness T2 in the first area A1 and the third thickness T3, which is thinner than the second thickness T2 in the second area A2, is disposed.

Referring to FIGS. 4 and 14, the third preliminary insulating layer pattern 112a is etched by the third thickness T3 to dispose the third insulating layer pattern 112 having the first thickness T1, which is equal to about the difference between the third thickness T3 and the second thickness T2. The third insulating layer pattern 112 may be disposed on the storage line SL in the area where the storage line SL crosses the data line DL.

Figure 15:
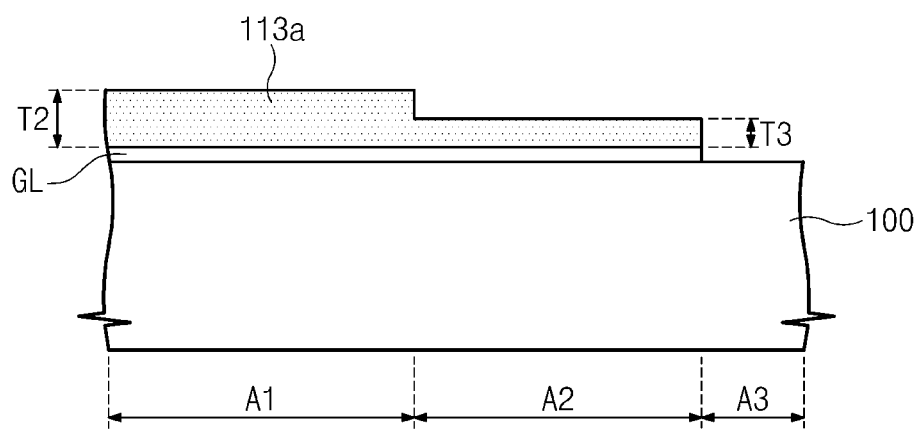
Figure 16:
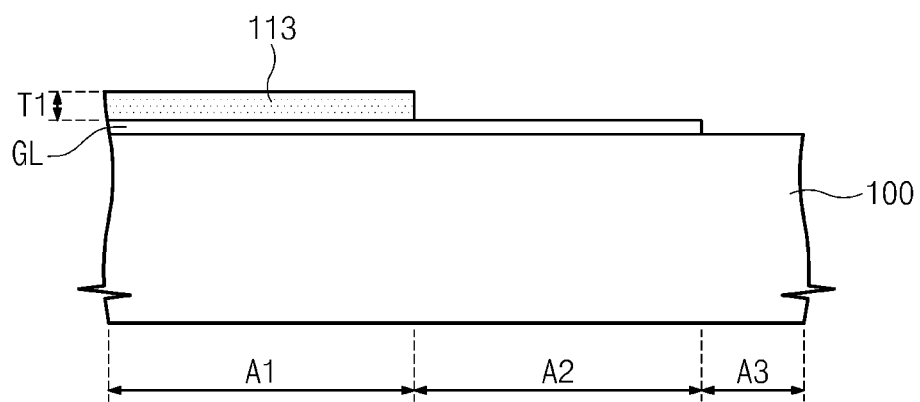

FIGS. 15 and 16 are cross-sectional views taken along line III-III' of FIG. 2 in manufacturing processes of the liquid crystal display shown in FIG. 5. FIGS. 8 and 15 show the liquid crystal display in the same manufacturing processes, and FIGS. 9 and 16 show the liquid crystal display in the same manufacturing processes.

Referring to FIGS. 7 and 15, the preliminary conductive layer 105 is disposed on the first base substrate 100, and the insulating layer 114 is disposed on the preliminary conductive layer 105. The greater amount of light is irradiated onto the first area A1 than that irradiated onto the second area A2 using the slit mask 230, and substantially no light is irradiated onto the third area A3. Then, when the insulating layer 114 exposed to the light is developed, a fourth preliminary insulating layer pattern 113a is disposed.

The fourth preliminary insulating layer pattern 113a has the second thickness T2 in the first area A1 and has the third thickness T3, which is thinner than the second thickness T2, in the second area A2, and the fourth preliminary insulating layer pattern 113a is removed in the third area A3. After disposing the fourth preliminary insulating layer pattern 113a, the preliminary conductive layer 105 is patterned using the fourth preliminary insulating layer pattern 113a to dispose the gate line GL.

Referring to FIG. 16, after disposing the gate line GL, the fourth preliminary insulating layer pattern 113a is etched by the third thickness T3 to dispose a fourth insulating layer pattern 113 having the first thickness T1, which is equal to about the difference between the third thickness T3 and the second thickness T2. Thus, the gate line GL is exposed to the exterior in the second area A2.

Referring again to FIG. 6, after disposing the fourth insulating layer pattern 113, the contact part 55 electrically connected to the gate line GL may be disposed in at least the exposed area of the gate line GL.

FIGS. 17 to 22 are cross-sectional views showing another exemplary embodiment of a manufacturing process of a liquid crystal display. In FIGS. 17 to 22, the same reference numerals denote the same elements in FIGS. 7 to 10, and thus the detailed description of the same elements is omitted.

Figure 17:
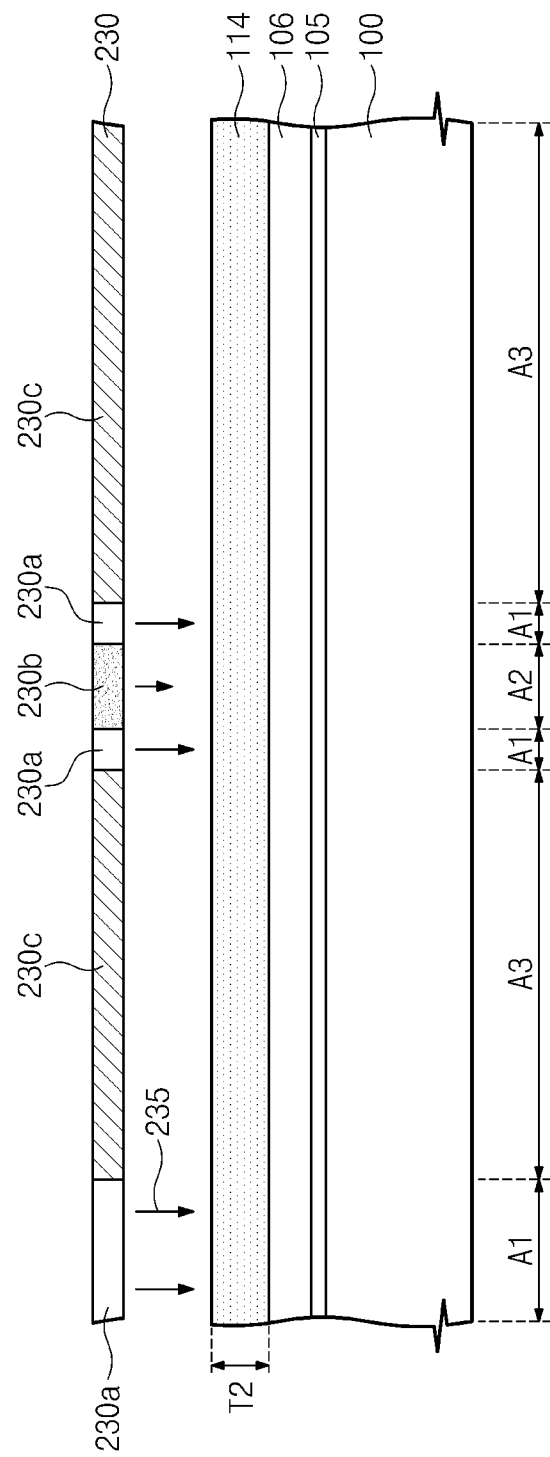
FIGS. 17 to 22 are cross-sectional views showing another exemplary embodiment of a manufacturing process of a liquid crystal device.
Figure 18:
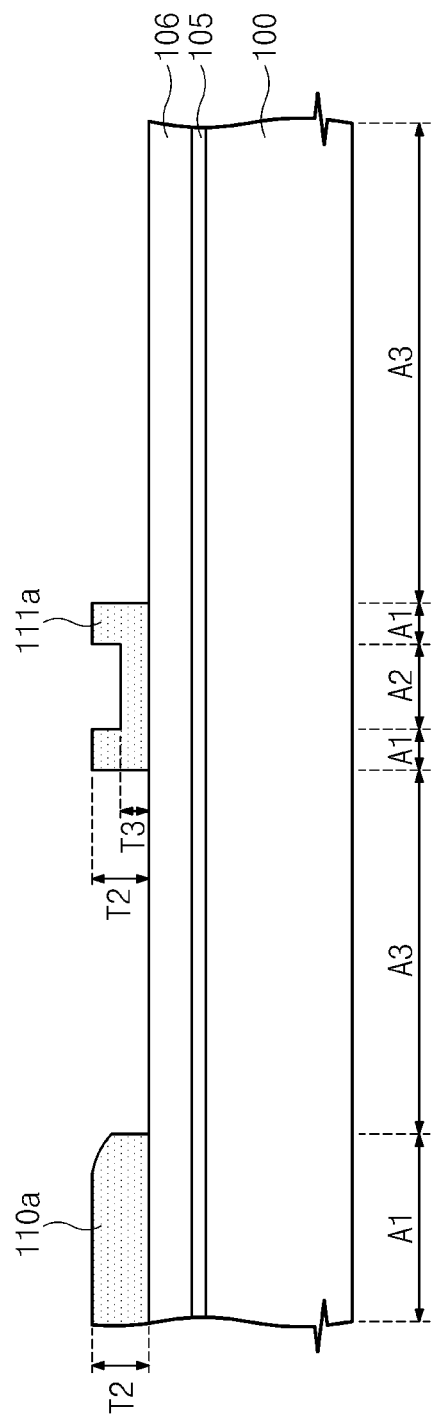

Referring to FIGS. 17 and 18, a preliminary conductive layer 105 is disposed on a first base substrate 100, and a low dielectric layer 106 is disposed on the preliminary conductive layer 105. The low dielectric layer 106 may have a thickness of between about 2500 Å to about 20000 Å, specifically between about 5000 Å to about 10000 Å, and can include an insulating material such as SiOF, SiOC, or the like, or a combination comprising at least one of the foregoing insulating materials, and have a dielectric constant less than or equal to about 4, specifically less than or equal to about 3.

An insulating layer 114 is disposed on the low dielectric layer 106. The insulating layer 114 may be disposed by disposing a negative photoresist onto the low dielectric layer 106. After disposing the insulating layer 114, the insulating layer 114 is exposed to light 234 using a slit mask 230. The slit mask 230, as described with reference to FIG. 7, has a transmission region 230a corresponding to a first area A1, a semi-transmission region 230b corresponding to a second area A2, and a non-transmission region 230c corresponding to a third area A3.

After exposing the insulating layer 114 to the light 235, the insulating layer 114 is developed to dispose a first preliminary insulating layer pattern 110a and a second preliminary insulating layer pattern 111a. The first preliminary insulating layer pattern 110a is disposed in the first area A1 and has a second thickness T2. Also, the second preliminary insulating layer pattern 111a has the second thickness T2 corresponding to the first area A1 and a third thickness T3, which is thinner than the second thickness T2 corresponding to the second area A2.

Figure 19:
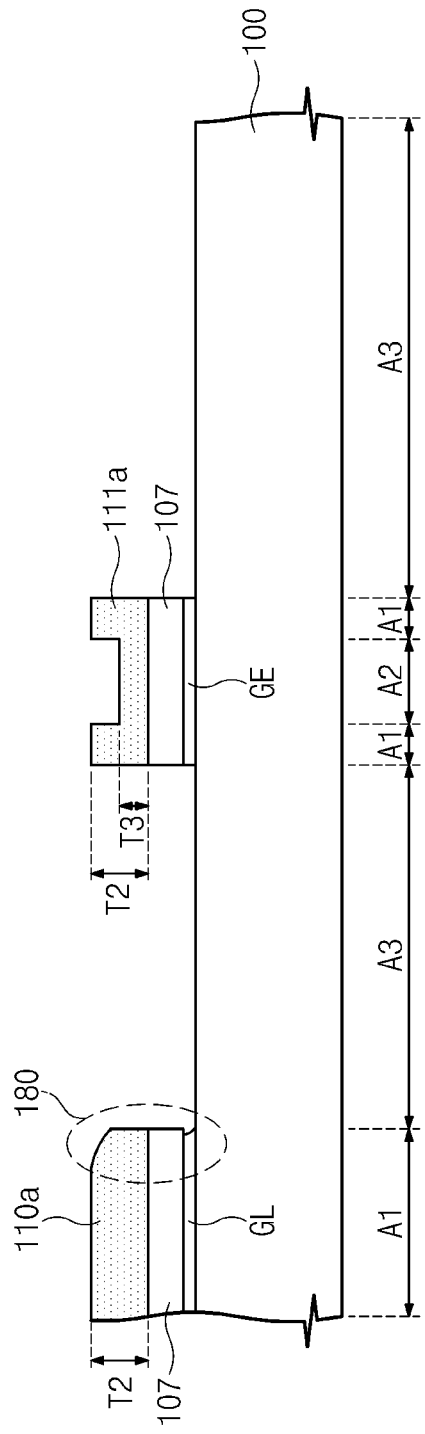
Figure 20:
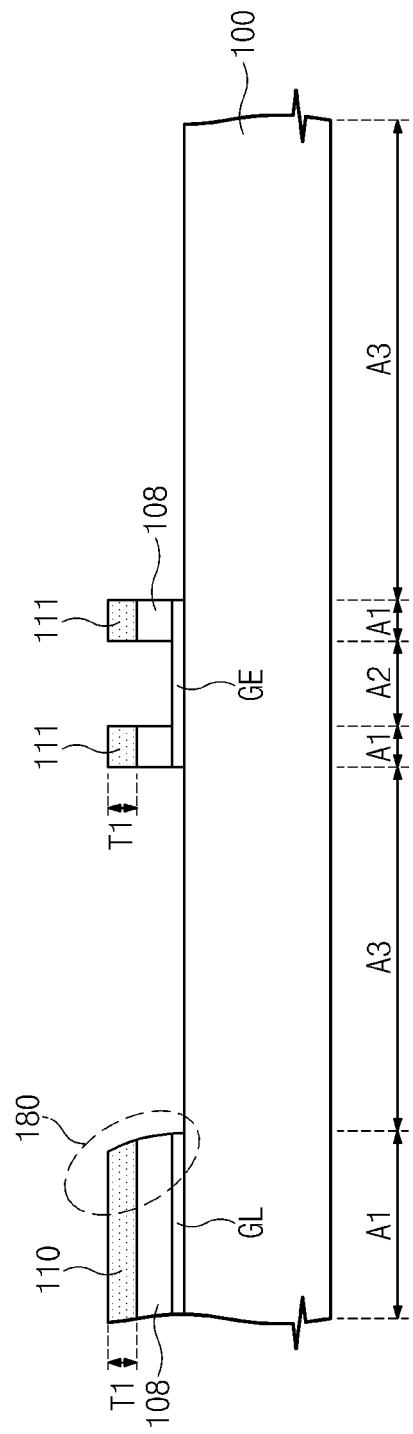

Referring to FIGS. 19 and 20, the low dielectric layer 106 (shown in FIG. 18) and the preliminary conductive layer 105 (shown in FIG. 18) are sequentially patterned using the first and second preliminary insulating layer patterns 110a and 111a as an etching mask. Thus, a preliminary low dielectric layer pattern 107, a gate line GL, and a gate electrode GE are disposed.

Then, the first and second preliminary insulating layer patterns 110a and 111a are removed by the third thickness T3 to dispose a first insulating layer pattern 110 and a second insulating layer pattern 111, respectively. Since the second preliminary insulating layer pattern 111a has the third thickness T3 corresponding to the second area A2, when the second preliminary insulating layer pattern 111a is removed by the third thickness T3, the second insulating layer pattern 111 having an opening corresponding to the second area A2 is disposed. Therefore, the preliminary low dielectric layer pattern 107 disposed under the second insulating layer pattern 111 is exposed to an exterior corresponding to the second area A2.

Figure 22:
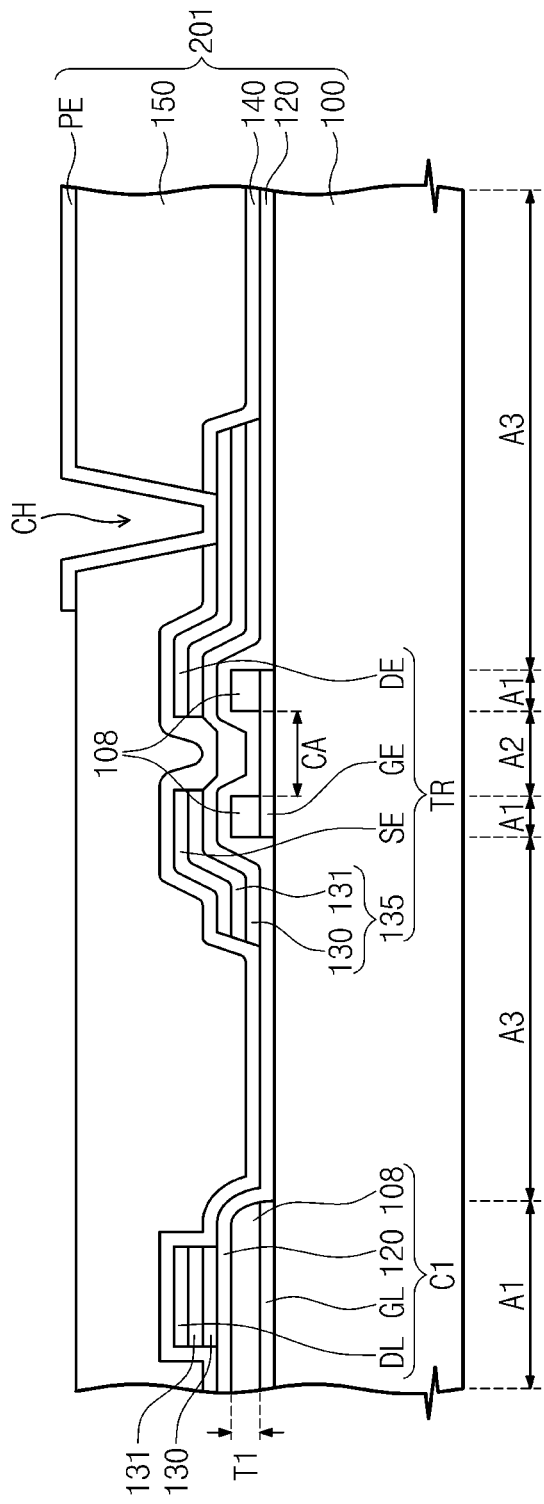

After disposing the first and second insulating layer patterns 110 and 111, the preliminary low dielectric layer pattern 107 exposed to the exterior in the second area A2 is removed to dispose a low dielectric layer pattern 108. Referring to FIG. 22, the low dielectric layer pattern 108 is interposed between the gate line GL and the data line DL, between the source electrode SE and the gate electrode GE, and between the drain electrode DE and the gate electrode GE.

In an embodiment, during the process to dispose the gate line GL and the gate electrode GE by patterning the preliminary conductive layer 105 (shown in FIG. 18), an under-cut may occur at a lower portion of the preliminary low dielectric layer pattern 107 according to the process condition of etching the preliminary conductive layer 105, so that the first preliminary insulating layer pattern 110a, the preliminary low dielectric layer pattern 107, and the gate line GL may have a rough profile 180.

In an embodiment, the shape of the profile 180 may be changed to a smooth shape during the process shown in FIG. 20. More particularly, when the first preliminary insulating layer pattern 110a is etched using an oxygen gas to dispose the first insulating layer pattern 110, the gate line GL and the gate electrode GE are not etched by the oxygen gas, thereby reducing a width difference between the first insulating layer pattern 110 and the gate electrode GE. In addition, when the preliminary low dielectric layer pattern 107 is etched to dispose the low dielectric layer pattern 108, a side portion of the preliminary low dielectric layer pattern 107 covered by the first insulating layer pattern 110 is etched, so that a width difference between the low dielectric layer pattern 108 and the gate electrode GE is reduced. Accordingly, the profile 180 may be smooth after performing the process shown in FIG. 20.

Figure 21:
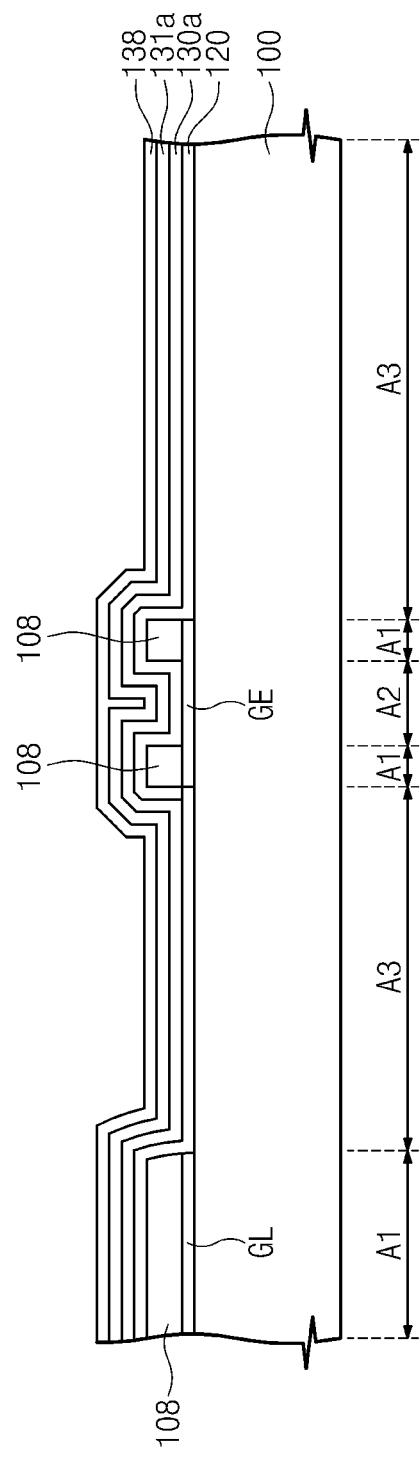

Referring to FIGS. 21 and 22, a gate insulating layer 120, a preliminary active layer 130a, a preliminary ohmic contact layer 131a, and a preliminary source-drain layer 138 are sequentially disposed on the first base substrate 100 to cover the low dielectric layer pattern 108.

The preliminary active layer 130a is patterned to dispose an active pattern 131, the preliminary ohmic contact layer 131a is patterned to dispose an ohmic contact pattern 131, and the preliminary source-drain layer 138 is patterned to dispose the data line DL, the source electrode SE, and the drain electrode DE, thereby completely disposing the thin film transistor TR.

When an inter-insulating layer 140, an organic insulating layer 150, and a pixel electrode PE are disposed on the thin film transistor TR, an array substrate 201 is completely disposed. The array substrate 201 is coupled with the color filter substrate 400 shown in FIG. 3, so that the liquid crystal display according to another exemplary embodiment is manufactured.

According to the above, the gate line is spaced apart from the data line by the thickness of the insulating layer pattern in the area where the gate line and the data line cross each other. Thus, the capacitance of the capacitor including the gate line and the data line may be reduced, so that the delay of the data signal transmitted through the data line may be reduced or substantially prevented.

In addition, since the insulating layer pattern can serve as a mask pattern used to dispose the gate line, an additional process to dispose the insulating layer pattern can be avoided.

Although the exemplary embodiments have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a first substrate comprising a pixel area;
   a gate line disposed on the first substrate;
   a data line disposed on the first substrate and insulated from the gate line;
   an insulating layer pattern interposed between the gate line and the data line in an area where the gate line and the data line overlap;
   a gate insulating layer interposed between the gate line and the data line;
   a pixel electrode disposed in the pixel area;
   a second substrate facing the first substrate; and
   a thin film transistor disposed on the first substrate and electrically connected to the pixel electrode,
   wherein the thin film transistor comprises:
      a gate electrode branching from the gate line;
      an active pattern disposed on the gate electrode and defining a channel area;
      a source electrode disposed on the active pattern, branching from the data line, and overlapping the gate electrode; and
      a drain electrode disposed on the active pattern, spaced apart from the source electrode, and overlapping the gate electrode,
   wherein the first substrate comprises a gate pad area adjacent to the pixel area, and the insulating layer pattern defines an opening in the gate pad area.

2. The display apparatus of claim 1, wherein the insulating layer pattern comprises a photosensitive material.

3. The display apparatus of claim 2, wherein the photosensitive material is a negative photoresist.

4. The display apparatus of claim 1, wherein the insulating layer pattern has a thickness of between about 2500 angstroms to about 20000 angstroms.

5. The display apparatus of claim 1, wherein the insulating layer pattern is disposed on the gate line.

6. The display apparatus of claim 1, wherein the insulating layer pattern is disposed on the gate electrode, overlaps the gate electrode, and defines an opening at a location which corresponds to a location of the channel area.

7. The display apparatus of claim 6, wherein the insulating layer pattern overlaps the source electrode and the drain electrode in an area outside the channel area.

8. The display apparatus of claim 1, wherein the insulating layer pattern does not overlap the pixel electrode.

9. The display apparatus of claim 1, further comprising
a storage line disposed on the first substrate, spaced apart from the gate line, and disposed perpendicular to the data line; and
a storage electrode branching from the storage line,
wherein the insulating layer pattern is interposed between the storage line and the data line in an area where the storage line and the data line overlap.

10. The display apparatus of claim 1, wherein the insulating layer pattern has a dielectric constant less than or equal to about 3.

* * * * *